(12) United States Patent
Otsuki et al.

(10) Patent No.: US 6,424,509 B1
(45) Date of Patent: Jul. 23, 2002

(54) SEMICONDUCTOR INCLUDING A PROTECTIVE CIRCUIT

(75) Inventors: Yoshimichi Otsuki; Shinichi Yamada, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/551,573

(22) Filed: Apr. 18, 2000

(30) Foreign Application Priority Data

Apr. 22, 1999 (JP) .......................................... 11-114393

(51) Int. Cl.$^7$ ................................................ H02H 9/00

(52) U.S. Cl. ...................................................... 361/56

(58) Field of Search ...................... 361/56, 91.1, 91.5, 361/111; 257/355–360

(56) References Cited

U.S. PATENT DOCUMENTS 5,623,387 A * 4/1997 Li et al. ........................ 361/56
5,825,600 A * 10/1998 Watt ............................ 361/56

* cited by examiner

Primary Examiner—Ronald W. Leja
(74) Attorney, Agent, or Firm—Arent Fox Kintner Plotkin & Kahn (57) ABSTRACT

A semiconductor device having a protective circuit, in order to prevent from breaking internal circuits according to electrostatic forces or noises generated on an input terminal is provided. In the semiconductor, a protective diode for countermeasures is applied to the overshoot between the input terminal and a power source wiring, and a MOS transistor is provided between the power source wiring and a ground wiring. The MOS transistor operates as a gate-controlled lateral transistor and becomes conductive earlier than a large size bipolar transistor resulting in providing protection between the input terminal and the ground wiring.

8 Claims, 10 Drawing Sheets

Semiconductor device according to the present invention

FIG. 1

Protective Circuit according to the present invention

FIG. 2

Example of input signal waveform

FIG. 3
Structural example of protective circuit

FIG. 4A

MOS transistor

Semiconductor device according to the present invention

SEMICONDUCTOR INCLUDING A PROTECTIVE CIRCUIT

BACKGROUND OF THE INVENTION

1. Field of the Invention

The present invention relates to a new protective circuit, for preventing breakage from electrostatic forces, which in provided on an input terminal of a semiconductor device, and more particularly, to a protective circuit having a higher protection capability than that of conventional protective circuits.

2. Description of the Related Art

Input signals provided from external devices, noises, or electrostatic forces are often concurrently supplied to the input terminal of semiconductor device. It is a concern that an overshoot or undershoot may occur on the input signal supplied to the input terminal and that it may result in breakage or damage of the internal circuit.

To counter the above damaging causes, the conventional semiconductor device includes a protective circuit, such as a diode or transistor, on its input terminal. The protective circuit includes a protective element for countering overshoot, a protective element for countering the undershoot, a protective element for countering charges caused by an excessive buildup of electrostatic forces, and the like.

Generally, the protective element for countering or enabling countermeasures to the overshoot is provided between the input terminal and an electrical power source wiring, and is activated to divert charge to an electrical power source wiring, when overshoot occurs on the input terminal. In a normal state, when a higher potential than that of the power source wiring is not generated on the input terminal, the protective circuit is not activated. Additionally, the protective element, for countermeasures applied to the undershoot, is provided between the input terminal and the ground wiring, and the protective circuit is activated to supply charge from the ground wiring to the input terminal and to suppress the generation of undershoot. In the normal state, when a lower potential than that of the ground potential is not generated on the input terminal, the protective circuit is not activated. The above described protective elements for overshoot and undershoot are respectively connected to the power source wiring having the higher potential and the ground wiring having the lower potential so that they are not activated in the normal state and are activated, only when the overshoot or undershoot occurs.

There is another approach in which a large sized transistor element to absorb a greater amount of charges is provided, when the larger charges caused by the electrostatic forces are applied to the external terminal.

In the conventional semiconductor device, power from the external devices is supplied to the inner circuits via the power source wiring. Therefore, in the conventional semiconductor device, the capacity of the power source wiring is as large as that of the ground wiring so that the power source wiring can absorb the charges, even if the charge is diverted to the power source wiring through the protective element for countermeasures applied to overshoot.

To reduce the consumption of power, however, the power supplied from the external device is nearly employed in all of the inner circuits of the recent semiconductor device. For example, a dynamic RAM (DRAM) contains an internal power source, of which potential is dropped from the external power source, in the internal circuit, and supplies internal power to the memory cells or the sense amplifiers occupying the chip. Consequently, there is a possibility that the ratio of the internal circuit employing the internal power source becomes high.

In the above semiconductor device, the charges cannot be sufficiently diverted through the external power source wiring through the elements for countermeasures applied to the overshoot, using a conventional protective circuit, and therefore, there is a higher possibility that the internal circuits connected to the external power source wiring will be damaged.

SUMMARY OF THE INVENTION

Accordingly, it is an object of the present invention to provide a semiconductor device having a protective circuit for countermeasures applied to electrical noises generated on an input terminal.

It is another object of the present invention to provide a semiconductor device having a protective circuit by which the overshoot generated on the input terminal can be effectively suppressed.

To achieve the above-described objects, in the semiconductor device according to the present invention, in addition to a protective diode for countermeasures applied to overshoot provided between the input terminal and a power source wiring, a MOS transistor is provided between the power source wiring and a ground wiring. The MOS transistor activates as a gate-controlled lateral transistor and becomes conductive earlier than a large sized bipolar transistor, therefore providing better protection between the input terminal and the ground wiring.

According to the above-structure of the protective circuit of the present invention, when the overshoot occurs in the input signal supplied to the input terminal, the protective diode becomes conductive to divert the charges, and further, the MOS transistor becomes conductive instead of or before the lateral bipolar transistor becomes conductive to divert the charges to the ground wiring. Additionally, the protective bipolar transistor becomes conductive to divert a greater amount of charges generated by the electrostatic forces to the ground wiring. Therefore, it becomes possible to prevent the greater amount of charges from flowing to the internal power source wiring connected to the internal circuit and thereby more effectively suppress the overshoot.

To achieve the above-described objects, a semiconductor device is provided including a power source wiring, a ground wiring and an input terminal supplied with an input signal from an external device and connected to internal circuits, comprising: a first semiconductor area of a first conductive type at a semiconductor substrate surface, a protective bipolar transistor having a collector area of a second conductive type, which is formed in a first semiconductor area of a first conductive type at a semiconductor substrate surface and connected to the input terminal and an emitter area of the second conductive type, which is formed in the first semiconductor area and connected to the ground wiring; a protective diode having an anode area of the first conductive type, which is formed in a second semiconductor area of the second conductive type at the semiconductor substrate surface and connected to the input terminal, the second semiconductor area being connected to the power source wiring as a cathode area; and a protective MOS transistor having a drain area of the second conductive type, which is formed in a third semiconductor area of the first conductive type at the semiconductor substrate surface and connected to the cathode area, a source area of the second conductive type, which is formed in the third semiconductor area and connected to the ground wiring, and a gate electrode, which is formed on the semiconductor substrate between the drain and source areas and connected to the ground wiring.

Additionally, to achieve the above-described objects, a semiconductor device including a power source wiring, a ground wiring, and an input terminal supplied with an input signal from an external device and connected to internal circuits, comprising: a protective diode, provided between the input terminal and the power source wiring, for becoming conductive when a high voltage is applied to the input terminal; and a protective MOS transistor, provided between a cathode terminal of the protective diode and the ground wiring, having a drain area of a second conductive type, which is formed in a first conductive type semiconductor area at a semiconductor substrate surface and connected to the cathode terminal, a source area of the second conductive type, which is formed in the first conductive type semiconductor area and connected to the ground wiring, and a gate electrode connected to the ground wiring, which is formed on the semiconductor substrate between the drain and source areas and connected to the ground wiring.

BRIEF DESCRIPTION OF THE PRESENT INVENTION

DESCRIPTION OF THE PREFERRED EMBODIMENTS

Hereinafter, preferred embodiments of the present invention are described with reference to the drawings. However, the technical scope of the present invention is not limited to these embodiments.

Figure 1:
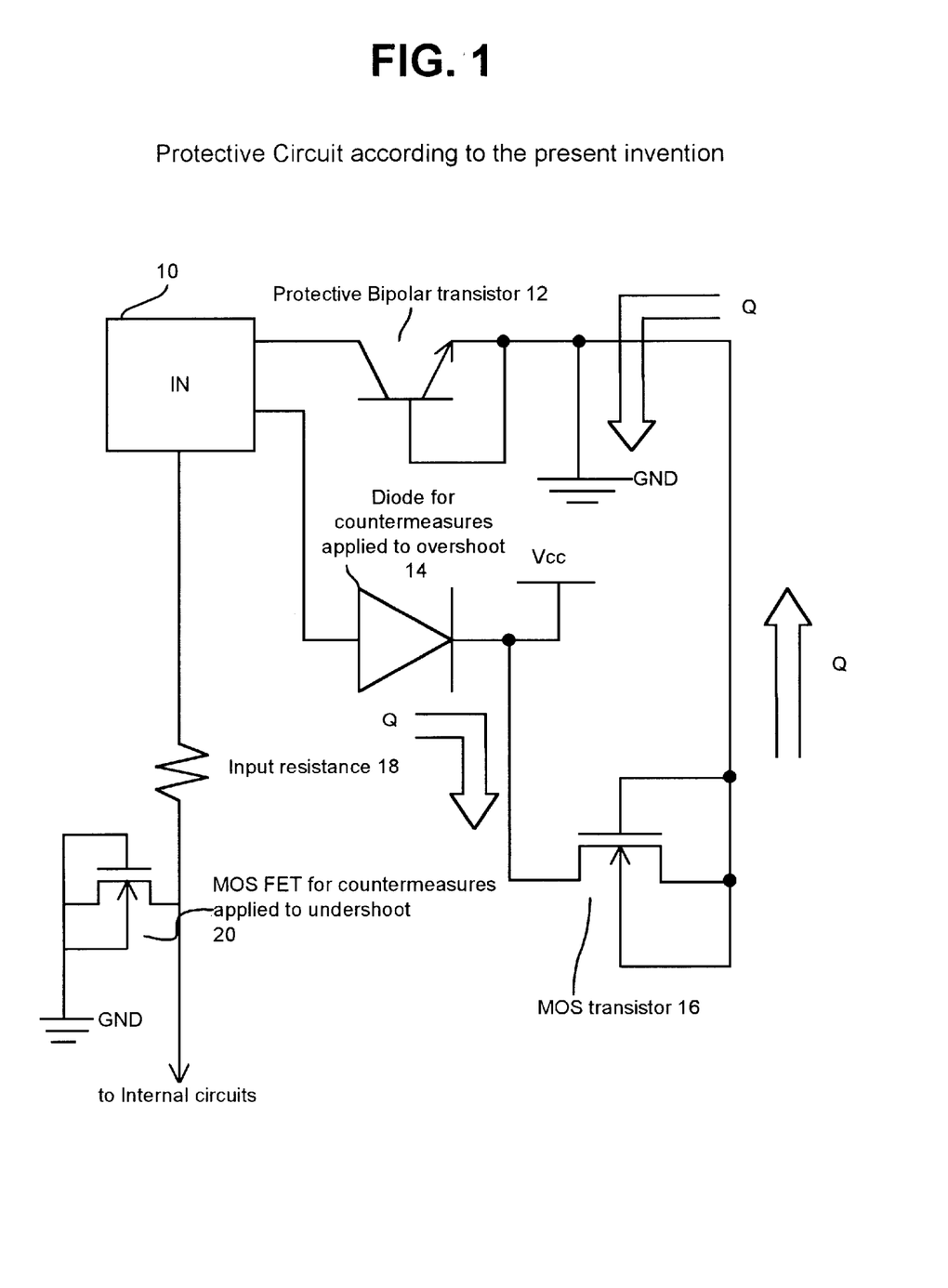
FIG. 1 is a structural example of a protective circuit according to the embodiment of the present invention.

FIG. 1 is a structural example of a protective circuit according to an embodiment of the present invention. The protective circuit shown in FIG. 1 has an input terminal 10 to which an input signal is supplied from external devices, connecting to a large-sized protective bipolar transistor 12 for diverting the greater amount of charges to the ground, a protective diode 14 for countermeasures applied to overshoot and an N channel MOS transistor 20 for countermeasures applied to undershoot. Additionally, in the present embodiment, a cathode terminal of the protective diode 14 is connected to an internal power source wiring Vcc, and the power source wiring Vcc is connected to the MOS transistor 16. The MOS transistor 16, of which source and gate are connected to a ground wiring GND, employs a function of a lateral bipolar transistor, which is parasitically formed by a drain, channel and source. Specifically, the MOS transistor 16 acts as a parasitic lateral bipolar transistor with a function of a gate-controlled diode.

The large-sized protective bipolar transistor 12 is formed by an NPN type transistor, for example, of which the collector is connected to the input terminal 10 and the base and the emitter are connected to the ground wiring GND. When a greater amount of charges caused by the electrostatic forces are supplied to the input terminal 10, the protective bipolar transistor 12 becomes conductive to direct the charges to the ground wiring GND. Therefore, the protective bipolar transistor 12 is generally formed with a large-sized dimension and is arranged near the input terminal 10. Details of the structure of the protective bipolar transistor 12 will be later described.

Figure 2:
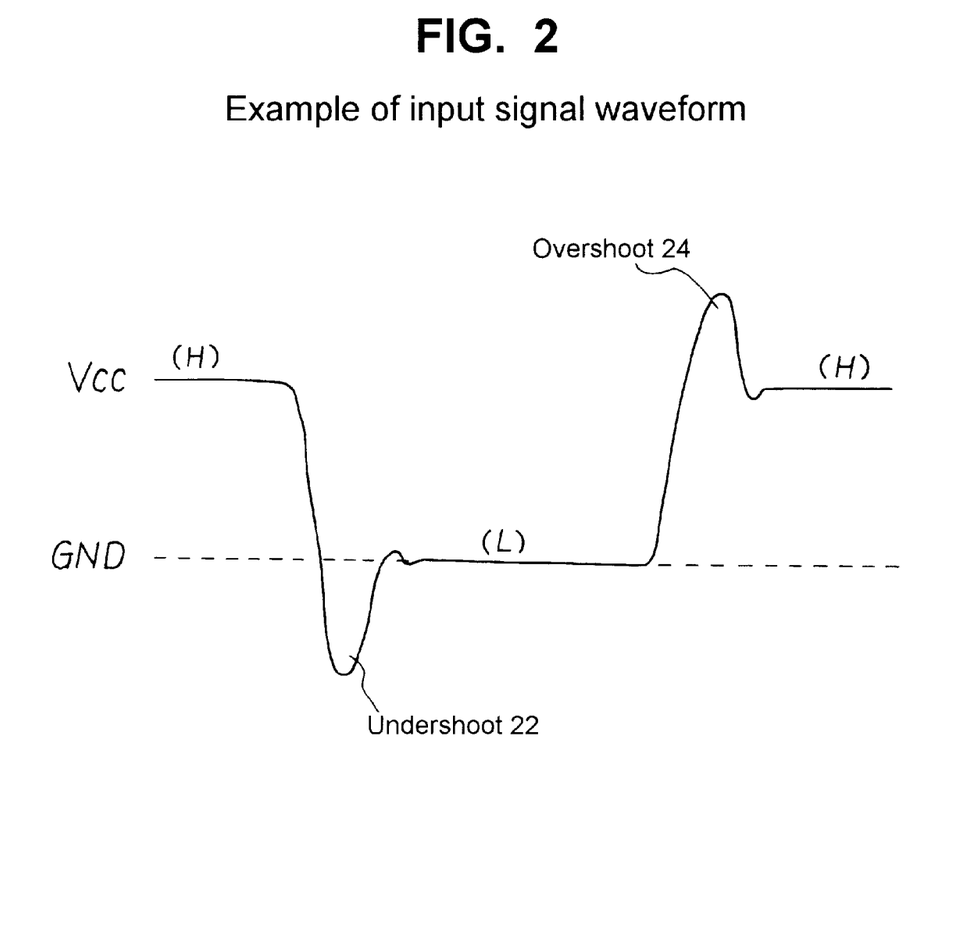
FIG. 2 shows an example of waveform of input signal.

FIG. 2 shows an example of a waveform of an input signal. In FIG. 2, an example input signal, illustrated by a bold line, is changed from the H level, which is the power Vcc level, to the L level, which is the GND level, and again changed to the H level. In the example of the waveform, an undershoot 22 or an overshoot 24 occurs when each level changes. If the undershoot 22 occurs, the level of the input signal becomes lower than the ground level GND and negative charges are generated. On the other hand, when the overshoot 24 occurs, the input signal level becomes higher than the power Vcc level and positive charges are generated.

Returning to FIG. 1, the MOS transistor 20 for countermeasures applied to undershoot has a source connected to the input terminal 10 through an input resistance 18, and a drain and a gate connected to the ground wring GND. When undershoot occurs in the input signal supplied to the input terminal 10, the potential at the source terminal becomes lower than that of the ground wiring GND, a voltage more than a threshold voltage is applied between the gate and source terminals so that the transistor 20 becomes conductive. Therefore, an electric current flows from the ground wiring GND to the input terminal 10 via the transistor 20, and the input signal, whose undershoot is suppressed, is supplied to the internal circuit, not shown.

The diode 14 for countermeasures applied to overshoot is biased in a forward direction, when the overshoot occurs on the input terminal 10, and the charge Q flows from the anode to the cathode of the diode 14. Then, the charge Q makes the potential of the drain area of the MOS transistor 16 higher 10 and makes the PN junction between the drain and channel areas of a reversed bias state. An electric current flows on the PN junction by avalanche breakdown generated in the reversed bias state, the potential of the channel area being parasitically a base area, increases and a parasitic lateral 15 bipolar transistor 16 becomes conductive by applying a voltage more than a forward bias voltage on the PN junction between the channel and source areas. As a result, the charge Q flowing through the protective diode 14 is diverted through the transistor 16 to the ground wiring GND. Therefore, the charge flowing to the internal power source wiring Vcc is decreased so as to protect breaking down the internal circuit connected to the internal power source wiring.

Figure 3:
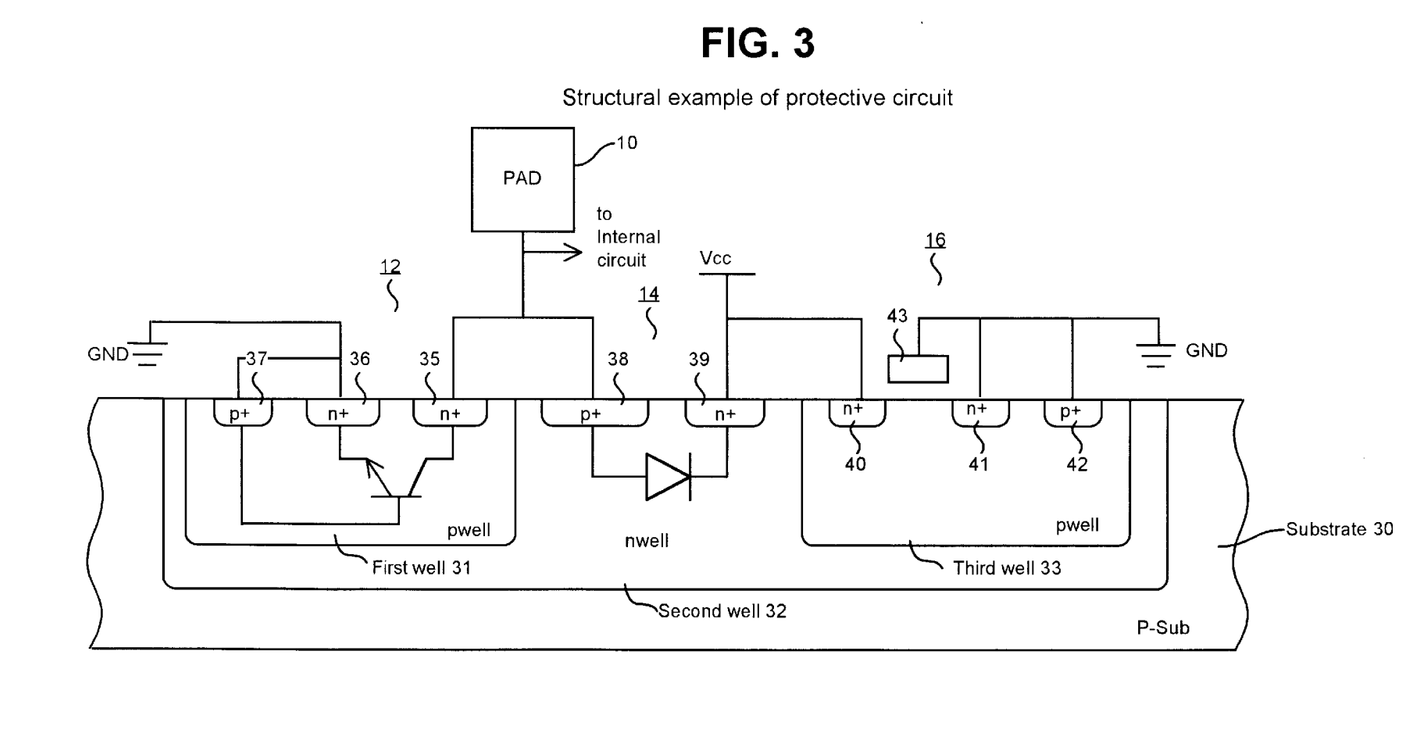
FIG. 3 is a cross-sectional view showing a specific structural example of the protective circuit shown in FIG. 1.

FIG. 3 is a cross-sectional view showing a detailed structural example of the protective circuit shown in FIG. 1.

A P type first well area 31, an N type second well area 32, and a P type third well area 33 are formed at a surface of a P type semiconductor substrate 30. Various combinations of the well 10 areas can be arranged, and they will be later described.

A protective bipolar transistor 12 for a greater amount of current is formed in the first well area 31, which is a P type first semiconductor area. In detail, the protective bipolar transistor 12 includes an N type collector area 35 formed in the P type first well area 31, an N type emitter area 36, a P type base contact area 37 to the first well area 31, which is a base area. The lateral bipolar transistor comprises the collector area 35, the base area 31 and the emitter area 36. The collector area 35 is connected to the input terminal 10, and the base contact and emitter areas 37, 36, respectively, are connected to the ground wiring GND. The protective transistor 12 includes a relatively larger well area 31 where relatively larger emitter and collector areas 35 and 36 are formed to absorb the greater electric currents.

Assuming that a higher voltage caused by electrostatic forces is applied to the input terminal 10, then, a reverse bias is applied to the PN junction between the emitter area 35 and a base area, which is a first well area 31. It is well known that when the reverse bias voltage is larger, an avalanche breakdown is generated on the PN junction and the current flows through it. As a result, the potential of the base area 31 becomes higher, a potential more than a forward voltage is applied to the PN junction between the base and collector areas 31 and 36, the lateral transistor 12 becomes conductive, and therefore, a greater amount of current flows from the input terminal 10 to the ground wiring GND.

A protective diode 14 is provided in an N type second well area 32. A P type anode area 38 and N type cathode contact area 39 are formed in the N type second well area 32. Then, the anode area 38 is connected to the input terminal 10 and the cathode contact area 39 is connected to the power source wiring Vcc.

Additionally, a protective MOS transistor 16 is formed in a P type third well area 33. An N type drain area 40, an N type source area 41, and a P type contact area 42 are formed in the P type third well area 33. Then, a gate electrode 43 is formed through an insulating film on a channel area between the drain and source areas 40, 41. The drain area 40 is connected to the cathode contact area 39 of the protective diode 14 and an internal power source wiring Vcc. The source area 41, the channel contact area 42 and the gate electrode 43 are connected to the ground wiring GND.

Considering parts other than the provision of the gate electrode 43, the protective MOS transistor 16 has approximately same structure as that of the bipolar transistor 12. Therefore, the MOS transistor 16 also activates as a parasitic lateral bipolar transistor comprising the drain, channel and source areas 40, 33 and 41. Moreover, the existence of gate electrode 43 makes the activation more sensitive than a normal lateral bipolar transistor.

In an embodiment of the present invention, according to a combination of the protective diode 14 and the MOS transistor 16 for diverting the charges to the ground wiring GND, when a great enough voltage to make the protective diode 14 conductive, which is not yet high enough to make the protective bipolar transistor 12 activate, is applied to the input terminal 10, the charge Q is effectively diverted to the ground wiring GND side.

The operation is as follows: assuming that overshoot occurs so that a higher voltage is applied to the input terminal 10, the protective diode 14 becomes conductive, the charge flows to the drain area 40 through the area 38, the second well area 32 and the contact area 39. As a result, a reverse bias is applied to the PN junction between the drain area 40 being parasitically a collector area and the channel area 33 being parasitically a base area. When the reverse bias becomes larger, the well-known avalanche breakdown is generated on the PN junction and the greater current flows from the N type drain area 40 to the P type channel area 33 so that the potential of the channel area (base area) 33 becomes higher. Accordingly, a voltage difference more than a forward voltage is generated on the PN junction between the P type channel area (base area) 33 and the N type source area (emitter area) 41, the lateral parasitic bipolar transistor becomes conductive, and a relatively larger charge. flows to the ground wiring GND side.

When a higher voltage is applied to the input terminal 10, a protective bipolar transistor 12 having a larger dimension becomes conductive and a greater current flows to the ground wiring GND side. In this way, although the MOS transistor 16 is not formed with the large dimension as the 13 protective bipolar transistor 12, when the higher voltage caused by the overshoot is applied to the input terminal 10, the charge Q flowing through the protective diode 14 can be diverted, not to the power supply wiring Vcc, but to the ground wiring GND. Since the gate electrode 43 is provided on the semiconductor substrate 30, the MOS transistor 16 becomes conductive at an earlier stage than the protective bipolar transistor 12 to divert the charge.

Figure 4A:
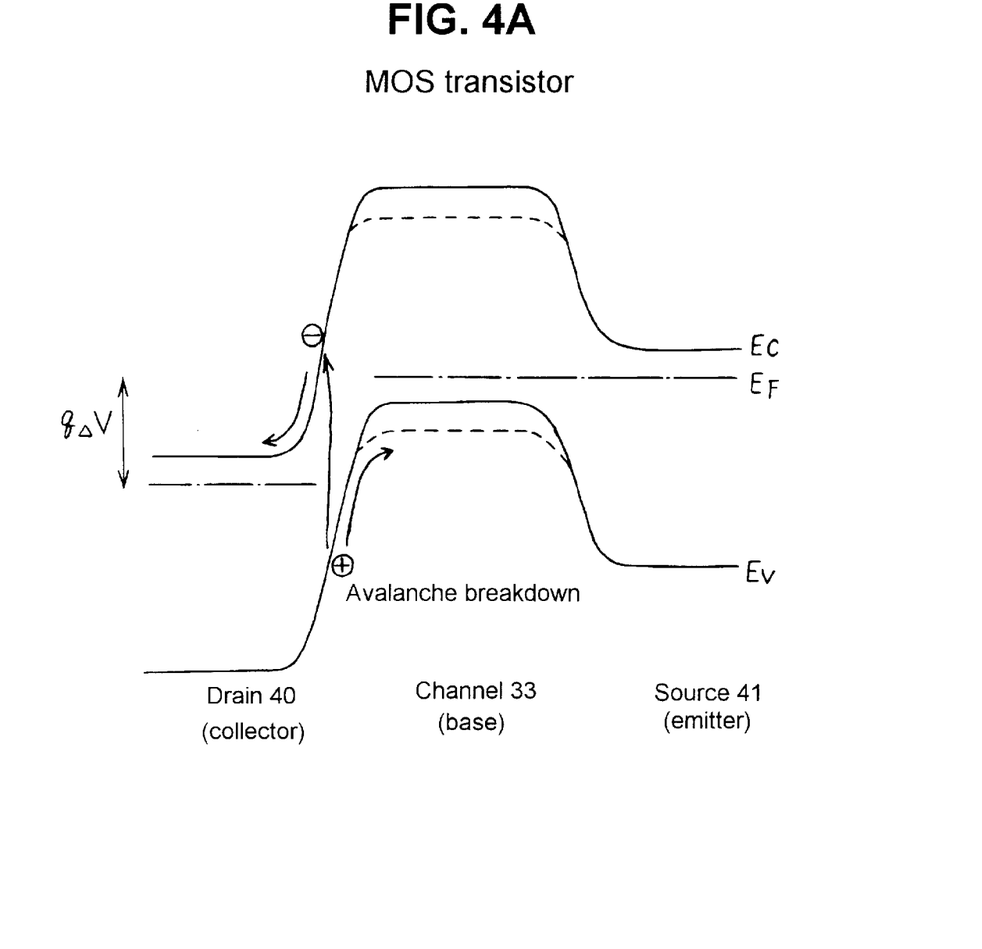
FIGS. 4A and 4B show energy band diagrams of a MOS transistor
Figure 4B:
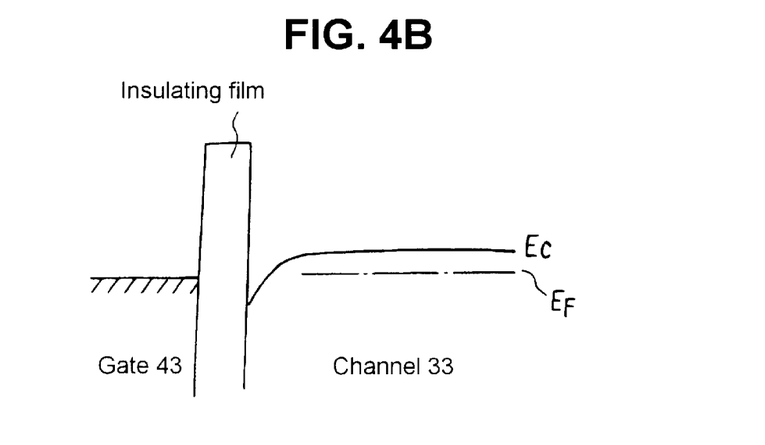

FIGS. 4A and 4B are energy band diagrams of the MOS transistor 16. FIG. 4A is a band diagram along a horizontal direction of FIG. 3. A position having a certain depth from a surface 30 of the substrate is illustrated by a bold line, and a band diagram of the surface 30 of the substrate is illustrated by a broken line. FIG. 4B is a band diagram along a vertical direction of FIG. 3. In FIGS. 4A and 4B, Ec means a bottom level of a conduction band, Ev means the highest level of a valence band, and Ef means Fermi level.

The MOS transistor 16 in horizontal direction becomes the same structure as a NPN lateral bipolar transistor. In FIG. 4A, a reverse bias $\Delta V$ is applied between the drain 40 and channel areas 33 so that an energy difference of $q\Delta V$ is generated. In this state, an avalanche breakdown is generated on a PN junction between the drain 40 and channel area 33. As a result, the energy level of the channel area 33 drops down, so that a voltage more than a forward rising voltage is applied to the PN junction between the channel 33 and source areas 41, and the parasitic lateral transistor becomes conductive.

A gate electrode 43 made by a metal or polycrystal silicon is formed on the upper part of the channel area 33 for the MOS transistor 16. As shown in FIG. 4B, the energy level at the substrate surface becomes lower than the area having a certain depth from the substrate surface, because the gate electrode 43 exists. That is, as illustrated by a broken line of FIG. 4A. The energy lowering caused by the gate electrode is not shown in a lateral protective bipolar transistor 12. The energy lowering at the substrate surface in the channel area 33 makes it easier than the protective lateral bipolar transistor 12 to make the MOS transistor 16 conductive. Specifically, against the voltage not being so higher or the charges not being so many, the parasitic lateral bipolar transistor of the MOS transistor 16 becomes conductive more sensitively to divert the charges to the ground wiring GND side.

A gate electrode of the above-described parasitic lateral bipolar transistor 16 is provided near a junction between the base and the emitter. That is, the junction between the base and emitter acts as a gate-controlled diode. The action of the gate-controlled diode is described in an article of chapter 10: Surface effect given to a PN junction of "Foundation knowledge of semiconductor device" written by A. S. Grove (edited by Yasuo Tarui, and translated by Kiyoshi Sugibuchi, Naoshi Sugiyama and Takeo Yoshikawa), for example.

Figure 5:
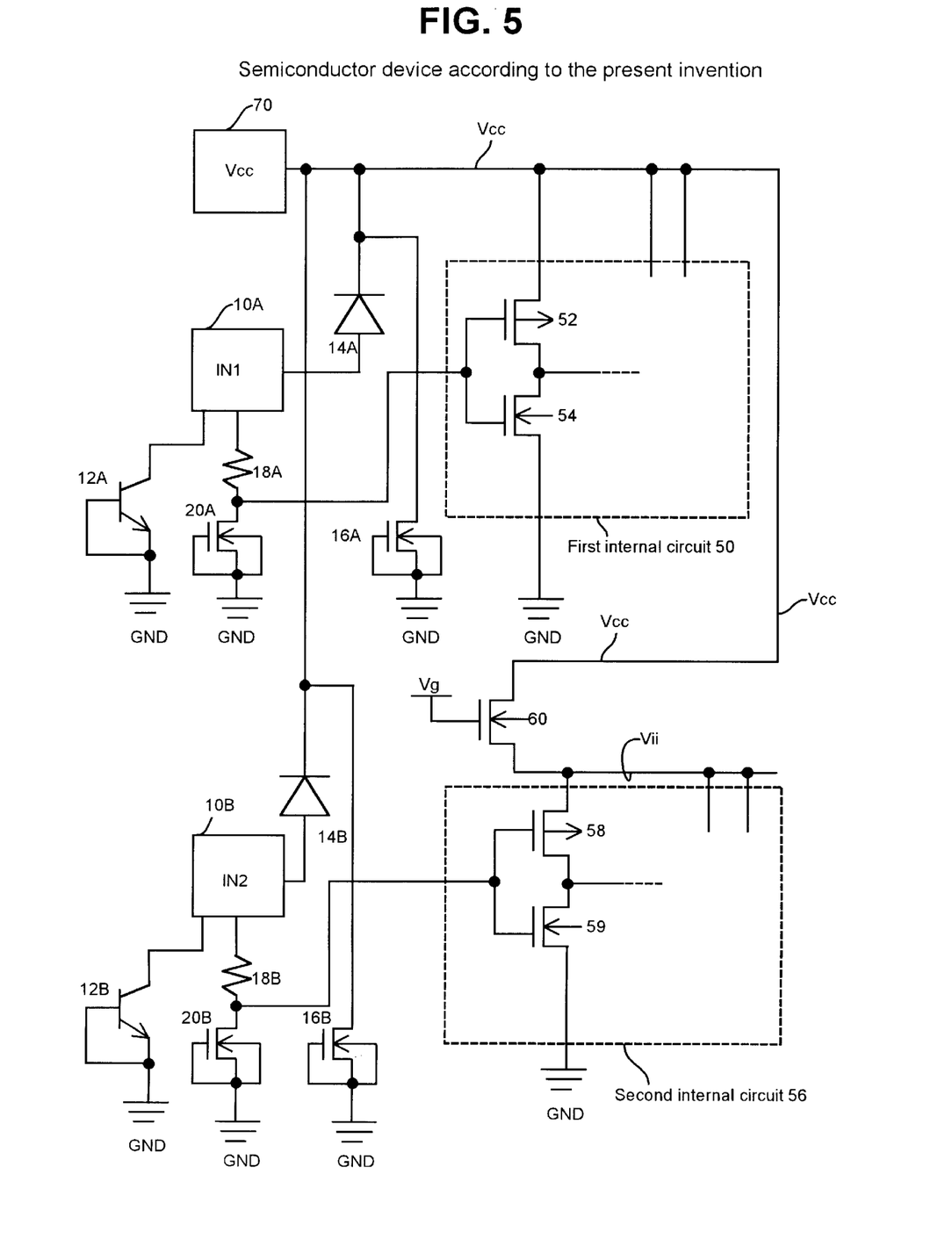
FIG. 5 is a structural example of a semiconductor device according to the embodiment of the present invention.

FIG. 5 is a structural example of a semiconductor device according to the embodiments of the present invention. FIG. 5 shows an example where a protective circuit is provided in a DRAM. In FIG. 5, an external terminal 70 for power supply and two input terminals 10A and 10B are provided. The external terminal 70 for power supply is connected to an internal power source wiring Vcc, which supplies the power to a first internal circuit 50. Therefore, the power source wiring Vcc is connected to a source terminal of a P channel transistor 52 provided in the first internal circuit 50, which is a CMOS inverter, for example.

On the other hand, the power source wiring Vcc does not supply the power source for all the internal circuits. Specifically, when employing a DRAM, a voltage dropped internal power source Vii is lower than the power source Vcc to supply the power source to the second internal circuit 56, in order to suppress the current consumption in the internal circuit. Therefore, the power source wiring Vec is connected to the drain of the N channel MOS transistor 60 forming a voltage drop circuit. An internally generated constant voltage Vg is supplied to the gate of the transistor 60, and the internal power source and current are supplied from the transistor 60, when the second internal circuit 56 operates in the active state. The voltage dropped power source -Vii becomes an available potential, which is obtained by dropping the threshold voltage Vth of the transistor 60 from the constant voltage Vg.

In the DRAM, the second internal circuit 56 is a memory cell array, for example, or a sense amplifier circuit for driving bit lines. The first internal circuit is an input buffer circuit or an output buffer circuit, for example, where compatibility with the external power source Vcc level is required, Therefore, in the DRAM, it is common to give the second internal circuit 56, which employs the internal voltage dropped power source Vii as a power source to have a larger circuit scale than the first internal circuit 50 employing the external power source Vcc. Additionally, the capacity of the wiring of the voltage dropped power source wiring Vii is larger than that of the external power source wiring Vcc.

The large sized bipolar transistor 12A, 12B respectively comprising a protective circuit, a protective diode 14A, 14B, and a MOS transistor 20, 20 provided between the diode 14A or 14B and the ground wiring GND are provided for each input terminal 10A, 10B in the semiconductor shown in FIG. 5. A MOS transistor 18A, 18B for countermeasures applied to undershoot is also provided in each input terminal 10A, 10B. The operation in the protective circuit for each input terminal is as described above.

The protective diode 14A, 14B and the MOS transistor 16A, 16B are provided to each input. terminal 10A, 10B of the semiconductor device of FIG. 5. When a greater voltage is applied to the input terminal the charges flow to the ground wiring GND side through the protective diode 14A, 14B and the MOS transistor 16A, 16B. As a result, the greater amount of charges do not flow to the power source wiring Vcc, which is connected only to the fewer internal circuits so as to break the source area of the transistor 52 in the first internal circuit 50 or the drain area of the transistor 60, a voltage drop circuit. Since the ground wiring GND is a very large electric conductor, which is connected to all the circuits in the semiconductor device, large amount of charges flow in to the ground wiring GND, and such changes are distributed to many circuits so that the breakdown of the circuit element does not happen.

Therefore, the embodiments of the present invention are more useful when the scale of the first internal circuit 50 connected to the external power source wiring Vcc is smaller than that of the second internal circuit 56 connected to the voltage dropped power source wiring Vii. That is because the charge from the protective circuit is prevented from flowing to the power source wiring Vcc, even if the scale of the first internal circuit 50 is small.

The MOS transistor 16A, 16B is OFF in a normal active state so that the current flowing from the power source wiring Vcc to the ground wiring GND does not exist.

FIGS. 6 through 10 are cross-sectional diagrams showing examples of combinations of the first, second, and third well areas (semiconductor areas). Each cross-sectional diagram shows an example where a P type first well area 31, an N type second well area 32, and a P type third well area 33 are formed in a P type semiconductor substrate 30. A protective bipolar transistor 32 is provided in the first well area 31, protective diode 14 is provided in the second well area 32, and a MOS transistor 16 is provided in the third well area 33. Connections among these areas are the same as those of the 18 above-described embodiment.

Figure 6:
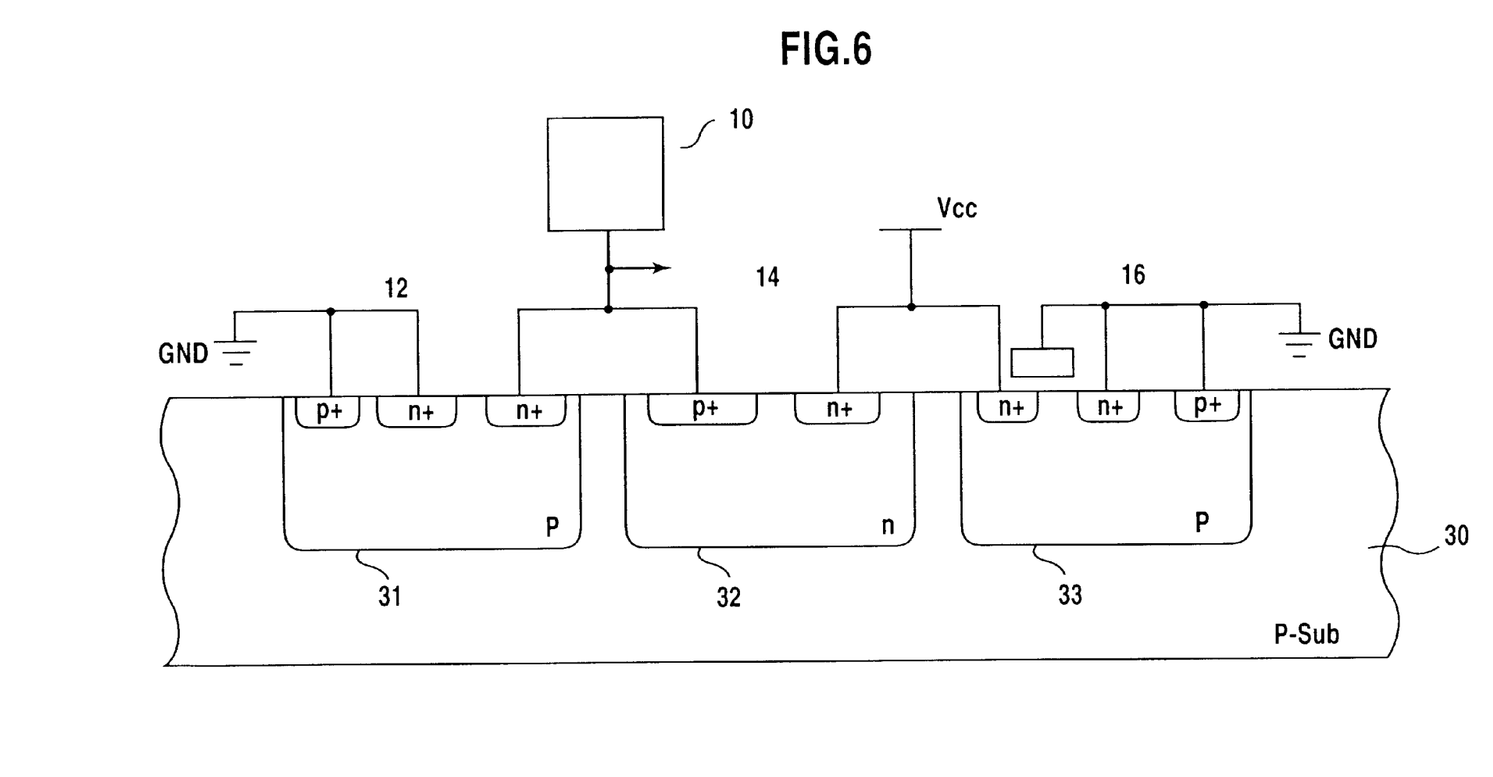
FIG. 6 is a cross-sectional view showing an example of a combination of the first, second and third well areas (semiconductor areas).
Figure 7:
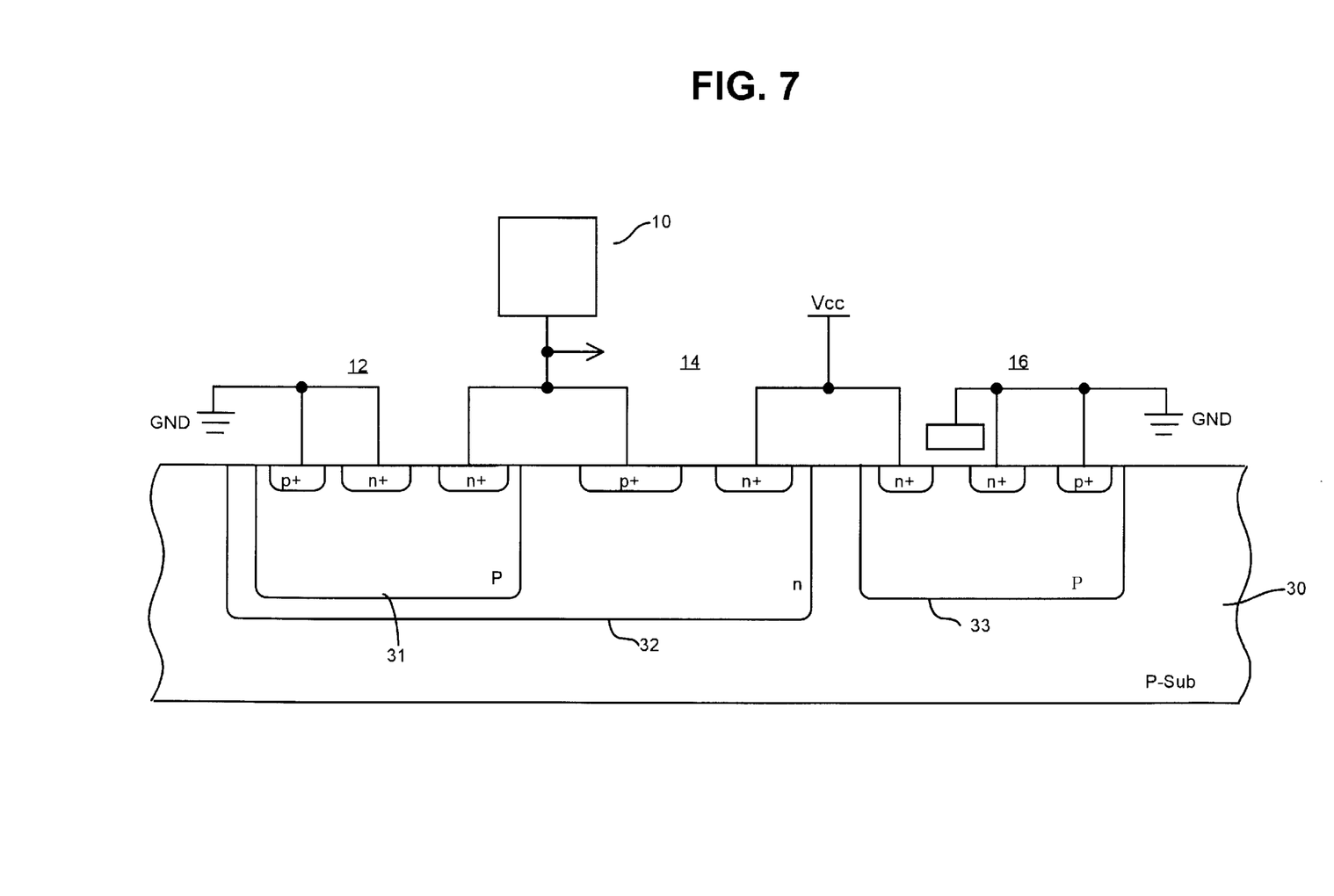
FIG. 7 is a cross-sectional view showing an example of a combination of the first, second and third well areas (semiconductor areas).
Figure 8:
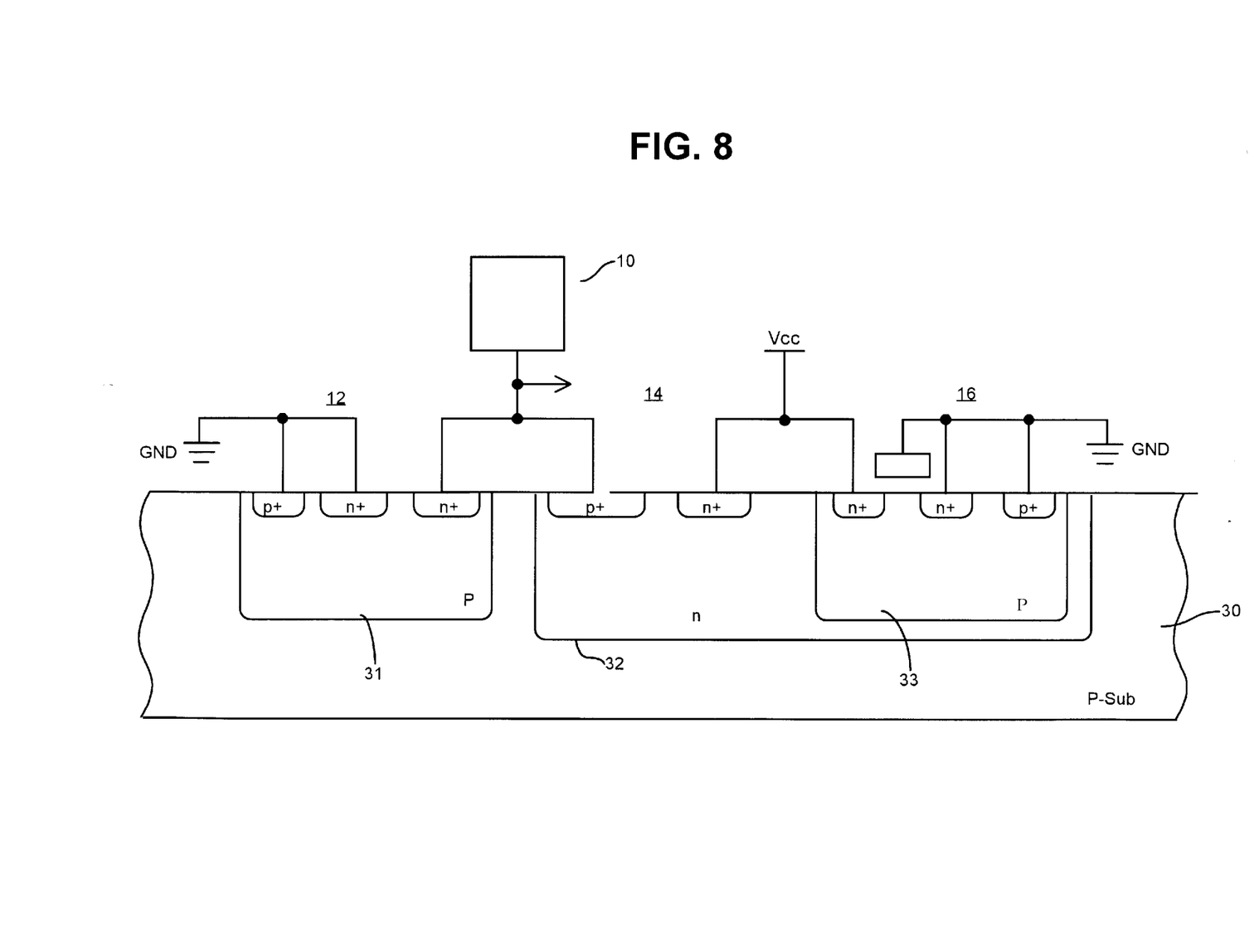
FIG. 8 is a cross-sectional view showing an example of a combination of the first, second and third well areas (semiconductor areas).

FIG. 6 shows an example where the first, second, and third well areas 31, 32, 33 are independently provided in the P type substrate 30. FIG. 7 shows an example where the second and third well areas 32, 33 are independently provided in the P type substrate 30 and the first well area 31 is provided in the second well area 32. FIG. 8 shows an example where the first and second well areas 31, 32 are independently provided in the P type substrate 30 and the third well area 33 is provided in the second well area 32, in opposite to the example of FIG. 7.

Figure 9:
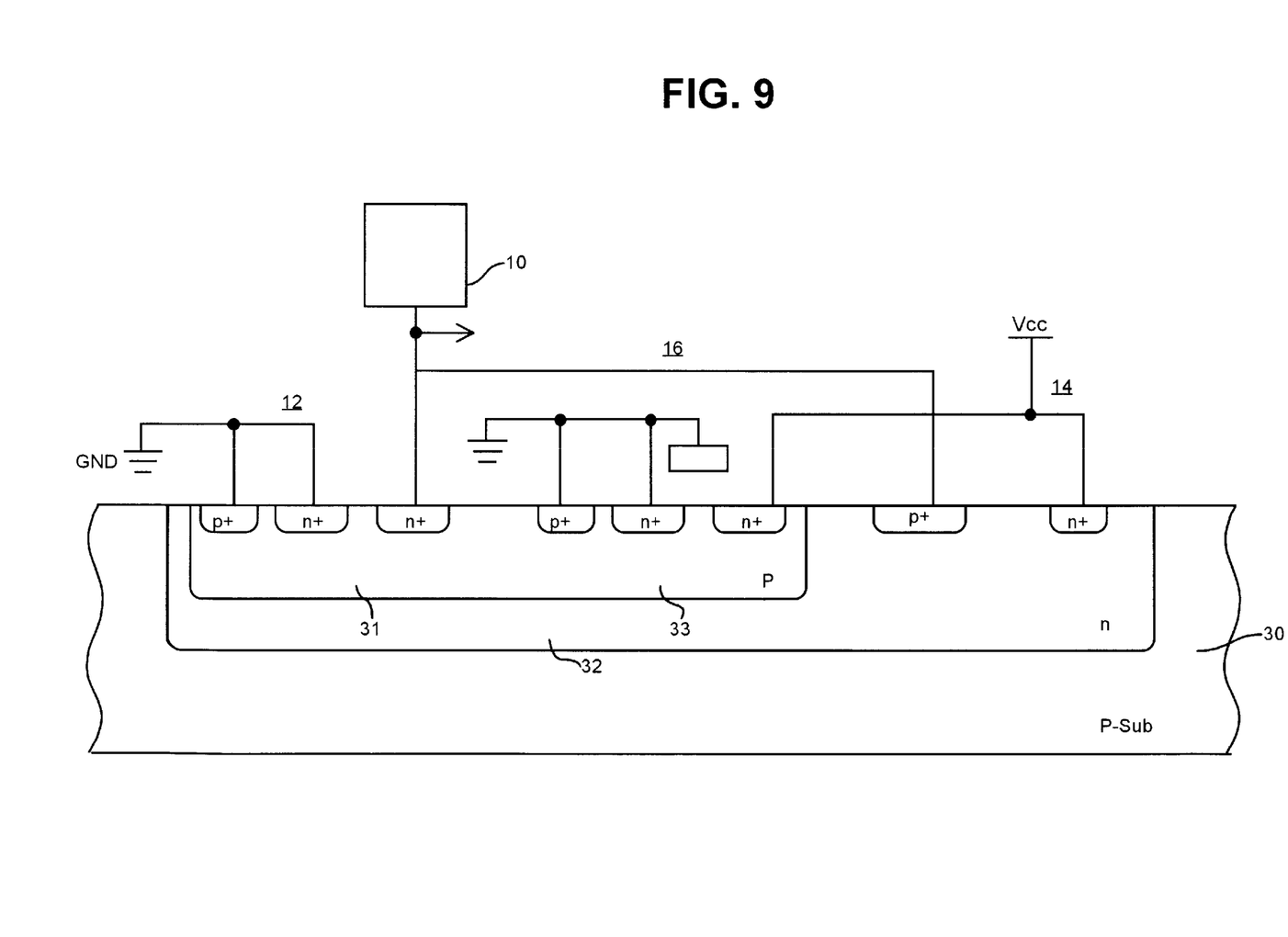
FIG. 9 is a cross-sectional view showing an example of a combination of the first, second and third well areas (semiconductor areas).

FIG. 9 shows an example where the second well area 32 is provided in the P type substrate 30 and the first and third well areas 31, 33 are commonly provided in the second well area 32, similarly to the structure of FIG. 3. A protective bipolar transistor 12 and a MOS transistor 16 are provided with a predetermined distance from each other in the commonly formed first and third well areas 31, 33.

Figure 10:
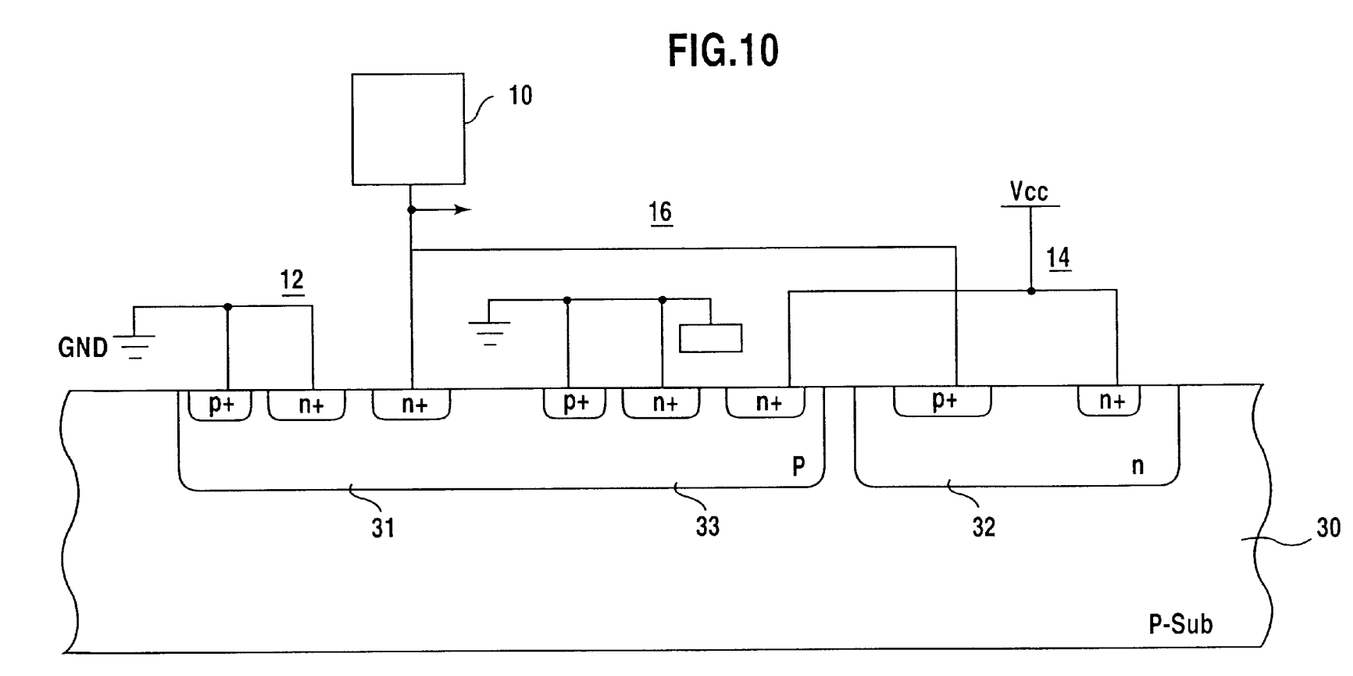
FIG. 10 is a cross-sectional view showing an example of combination of the first, second and third well areas (semiconductor areas).

FIG. 10 shows an example where the commonly formed first and third well areas 31, 33, and the N type second well area 32 are independently provided in the P type substrate 30. The protective bipolar transistor 12 and the MOS transistor 16 are provided with a predetermined distance in the commonly formed P type first and third well areas 31, 33.

As described above, the first, second and third well areas (semiconductor areas) where the protective elements 12, 14, 16 are formed can be formed with an optional combination at a semiconductor substrate surface. A suitable combination is selected according to a structure of internal circuit in the semiconductor device.

In the above-described embodiment, although a lateral bipolar transistor is employed as a protective bipolar transistor 12, a vertical type bipolar transistor may be employed. However, in case of a semiconductor device using a MOS transistor, it is preferable to have a structure of a lateral bipolar transistor as shown in FIG. 3.

As described above, according to the present invention, even if an irregular voltage being different from that in the normal state is applied to an input terminal, internal circuits can be protected effectively.

What is claimed is:

1. A semiconductor device including a power source wiring, a ground wiring and an input terminal supplied with an input signal from an external device and connected to internal circuits, comprising:

a first semiconductor area of a first conductive type at a semiconductor substrate surface;

a protective bipolar transistor having a collector area of a second conductive type, which is formed in the first semiconductor area of the first conductive type at the semiconductor substrate surface and connected to the input terminal and an emitter area of the second conductive type, wherein the emitter is formed in the first semiconductor area and connected to the ground wiring;

a protective diode having an anode area of the first conductive type, which is formed in a second semiconductor area of the second conductive type at the semiconductor substrate surface and connected to the input terminal, the second semiconductor area being connected to the power source wiring as a cathode area; and a protective MOS transistor having a drain area of the second conductive type, which is formed in a third semiconductor area of the first conductive type at the semiconductor substrate surface and connected to the cathode area, a source area of the second conductive type, which is formed in the third semiconductor area and connected to the ground wiring, and a gate electrode, which is formed on the semiconductor substrate between the drain and source areas and connected to the ground wiring.

2. The semiconductor device according to claim 1, wherein the first and third semiconductor areas are formed in the second semiconductor area.

3. The semiconductor device according to claim 1, wherein the first or third semiconductor area is formed in the second semiconductor area.

4. A semiconductor device including a power source wiring, a ground wiring and an input terminal supplied with an input signal from an external device and connected to internal circuits, comprising:

a protective diode, provided between the input terminal and the power source wiring, for becoming conductive when a high voltage is applied to the input terminal;

a first conductive type semiconductor area at a semiconductor substrate surface; and a protective MOS transistor, provided between a cathode terminal of the protective diode and the ground wiring, having a drain area of a second conductive type, which is formed in the first conductive type semiconductor area at the semiconductor substrate surface and connected to the cathode terminal, a source area of the second conductive type, which is formed in the semiconductor area and connected to the ground wiring, and a gate electrode, which is formed on the semiconductor substrate between the drain and source areas and connected to the ground wiring.

5. A semiconductor device including a power source wiring, a ground wiring and an input terminal connected to internal circuits, comprising:

a protective diode having an anode connected to said input terminal and a cathode connected to said power source wiring; and a protective NMOS transistor having a drain connected to said cathode, and a gate and source both of which are connected to said ground wiring.

6. The semiconductor device according to claim 5, further comprising:

a protective bipolar transistor having a collector connected to said input terminal, and a base and an emitter both of which are connected to said ground wiring.

7. The semiconductor device according to claim 6, further comprising:

a second protective NMOS transistor connected between said input terminal and said ground wiring to suppress an excessive voltage drop at said input terminal.

8. The semiconductor device according to claim 5, wherein an avalanche breakdown is occurred in said protective NMOS transistor when an excessive reverse bias is applied thereto.

* * * * *